United States Patent [19]

Rometsch et al.

[11] 4,398,180
[45] Aug. 9, 1983

[54] CONTACTLESS KEYBOARD

[75] Inventors: Johannes Rometsch, Rickenbach; Werner U. Frey, Thalwil; Hans Diem, Schindellegi, all of Switzerland

[73] Assignee: International Standard Electric Corporation, New York, N.Y.

[21] Appl. No.: 274,895

[22] Filed: Jun. 18, 1981

[30] Foreign Application Priority Data

Jun. 26, 1980 [CH] Switzerland ............ 4897/80

[51] Int. Cl.³ .............. H03K 13/00; G06F 3/02
[52] U.S. Cl. ............... 340/365 L; 336/110
[58] Field of Search ........... 340/365 R, 365 L, 365 S; 178/17 C, 18, 19; 179/90 K; 336/110, 75, 130, 20

[56] References Cited

U.S. PATENT DOCUMENTS 3,623,081 11/1971 Scarbrough ............ 340/365 L
3,911,429 10/1975 Vinal ................... 340/365 L
4,283,714 8/1981 Trenkler et al. ........ 340/365 L

FOREIGN PATENT DOCUMENTS 1549489 8/1972 Fed. Rep. of Germany .
45-12415 5/1970 Japan ................... 340/365 L
579799 9/1976 Switzerland .
1315885 5/1973 United Kingdom .

Primary Examiner—Thomas A. Robinson
Attorney, Agent, or Firm—John T. O'Halloran; Peter R. Ruzek

[57] ABSTRACT

In a contactless keyboard including for each key a transformer with a core displaceable by the key operation and including a compensation transformer common to all key the compensation transformer is so designed that with an unactuated key the signal component of the compensation transformer in the signal applied to the evaluation circuit exceeds the component of the key transformer, whereas with an actuated key the signal component of the key transformer predominates. Therefrom results a phase change of the signal applied to the evaluation circuit with the actuation of a key. The evaluation circuit compares the phase of the key output signal with that of a reference signal. For increasing the immunity from disturbance the evaluation circuit delivers an output signal (key operated or key nonoperated) only when several successive comparison operations give the same result.

11 Claims, 4 Drawing Figures

CONTACTLESS KEYBOARD

The present invention relates to a contactless keyboard including for each key a transformer provided with a movable plunger type core wherein primary windings of a row or column of key transformers can be connected, in series with the primary winding of a compensation transformer not allocated to any of the keys, via a connecting member to an AC source controlled by a clock signal and the secondary windings of a column or row can be connected, in series with the secondary winding of the compensation transformer, via a selecting member to an evaluation circuit.

It is known to use inductive elements, e.g. transformers for contactless keyboards and to increase the coupling between the primary and the secondary windings by inserting a core with the actuation of a key. Further it is known to compensate for the open circuit voltage resulting from the coupling between the primary and the secondary winding with released key by a further similar transformer not allocated to any of the keys and having one winding of opposite sense of winding in order to receive the maximum level difference between a non actuated key and an actuated key. From Swiss Patent No. 579.799 there is known a contactless keyboard of the above kind wherein a matrixlike keyboard is scanned and wherein with a depressed key a single scanning pulse is applied to the evaluation circuit wherein it is amplified and detected.

From the British Pat. No. 1,315,885 there is known a contactless keyboard with pairwise interconnected pulse transformers wherein the compensation of the open circuit voltage is performed within a pair of keys.

It is common to all known contactless keyboards with inductive or capacitive coupling of a scanning signal to an evaluation circuit that the amplitude of the key output signal is evaluated in the evaluation circuit in order to detect whether a distinct key is actuated or not. Thus the amplitude of the signal to be evaluated has to be compared with a reference amplitude, the value of which must exceed the open circuit signal with non-actuated key by a certain amount. The open circuit signal must be as small as possible since the amplitude of the signal which can be achieved with operated key is also limited. Thus the above circumstances result in a relatively low signal-to-noise ratio and call for relatively high requirements with respect to the time constancy of the components used for the key and the evaluation circuit.

It is therefore an object of the present invention to provide a contactless keyboard with inductive coupling wherein the phase of the output signal of the key matrix rather than the amplitude is used as a criterion for the evaluation. Further the keyboard should be provided with a simple possibility of adjusting the response sensibility of the keyboard.

The keyboard according to the invention is characterised in that the compensation transformer is so designed that the secondary voltage of a key transformer rendered active via the connecting member and the selecting member is overcompensated with released key so that with the actuation of a key the signal on the evaluation circuit performs a phase shift, and that the evaluation circuit is provided with comparison means comparing the phase of the signal to be evaluated with that of a reference signal.

The invention will be best understood from the following description of an embodiment taken in conjunction with the accompanying drawing in which.

Figure 2:
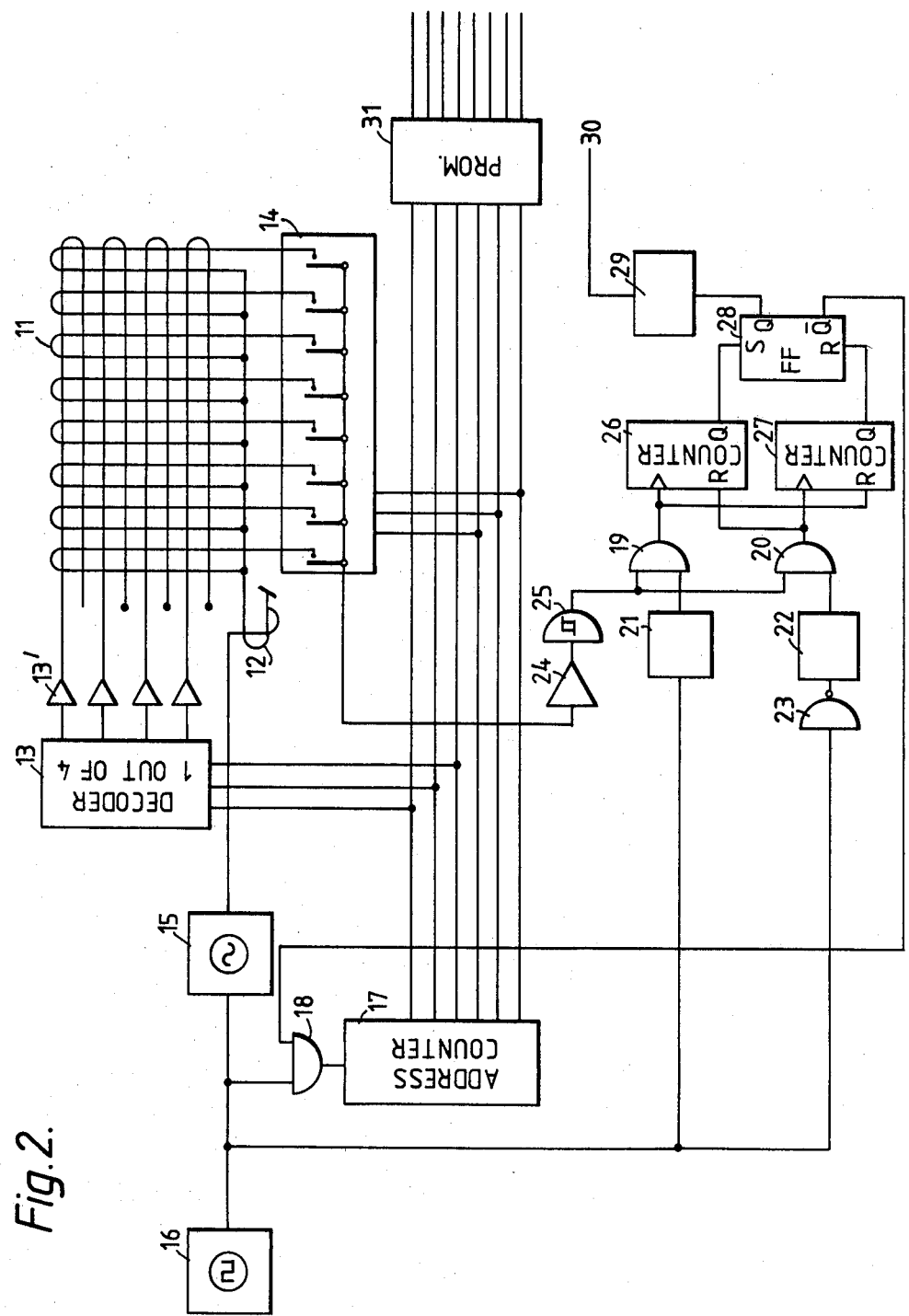
FIG. 2 shows a block diagram of a keyboard including 32 keys.

FIGS. 3(a)-(j) show a pulse diagram of signals at different points of the circuit according to FIG. 2.

Figure 1:
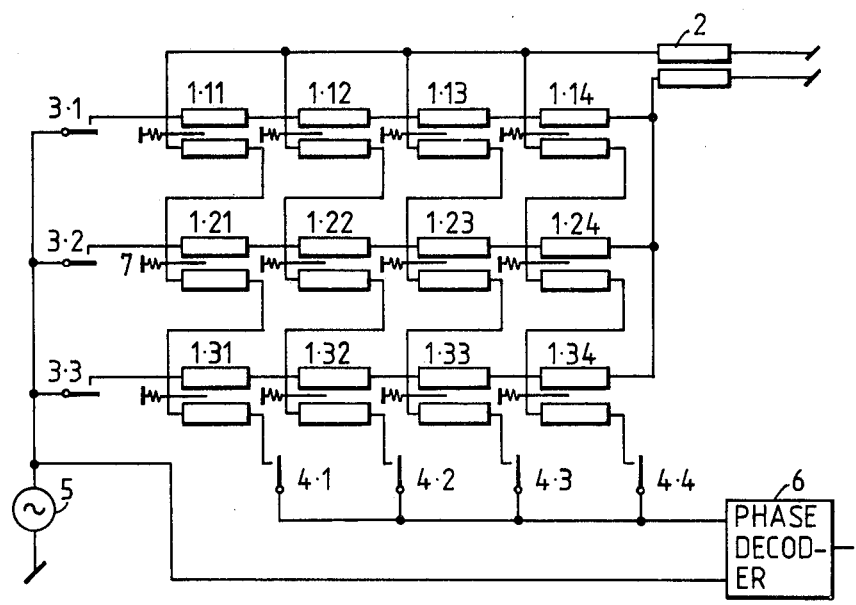
FIG. 1 shows the principal diagram of a keyboard including transformers.

The keyboard according to FIG. 1 is provided with 12 transformers 1 each including a displaceable core 7. The primary windings of a row of key transformers are connected in series and can be connected via a switch 3 illustrated as a contact to a generator 5. The secondary windings of each column are also connected in series and can be connected via a switch 4 to a phase detector 6. The non-switched ends of all series connections of primary windings are connected in series with the primary winding of a compensation transformer 2 whereas its secondary winding is connected in series with the non-switched ends of all series connections of secondary windings.

In order to scan the keyboard e.g. the row switch 3.1 is closed and each individual column is scanned by the successive closing of the switches 4. Then switch 3.2 is closed and the column scanning is repeated, and so on. Thus at the given time only one of the key transformers is rendered active to which the compensation transformer is connected in series.

In contrast to the known circuits the compensation transformer 2 is not so designed that with released key, i.e. with non-introduced core, it compensates for the open circuit voltage due to the air induction to a value near zero. Rather, it is so designed that an overcompensation is performed. That means that the secondary signal applied to the evaluation circuit is composed of two components, namely of the secondary voltage of the compensation transformer and of the secondary voltage of the key transformer rendered active. With a released key the component of the compensation transformer predominates whereas with activated key that of the key transformer predominates. Since the two components are in phase opposition, the detection of a key operation can be performed by a phase comparison between the key output signal and the signal of the generator, which comparison is done in the phase detector 6.

Figure 3:
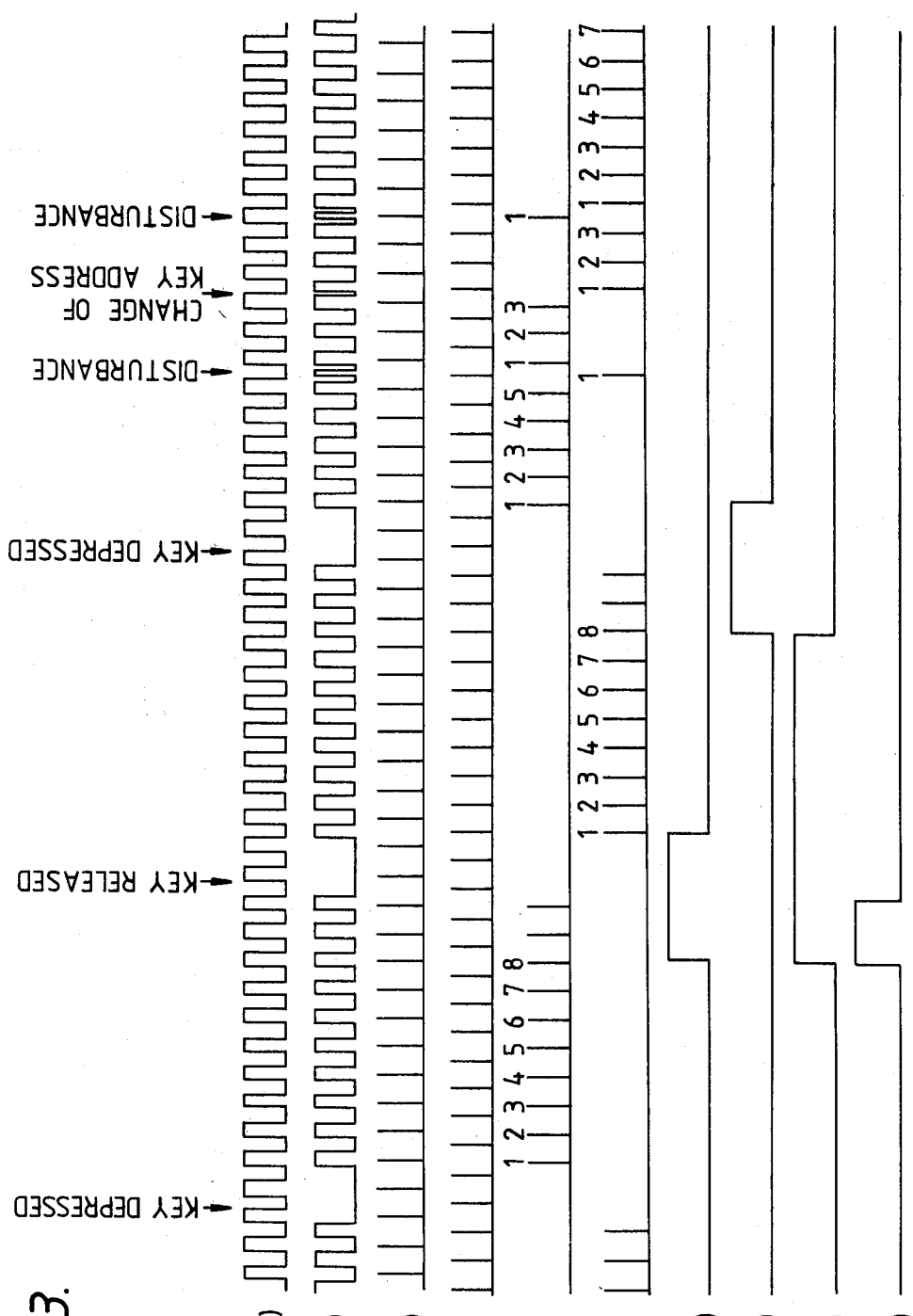
Figure 4:
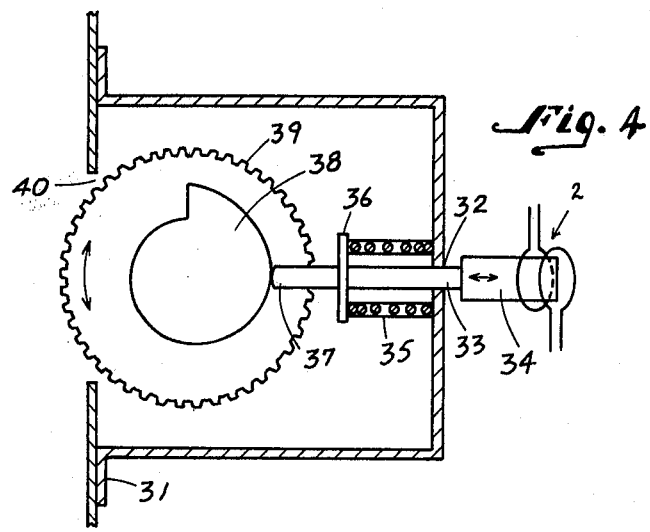
Figure 5:
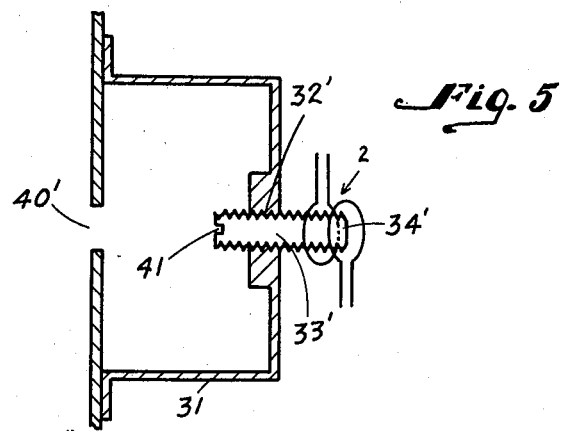
Figure 6:
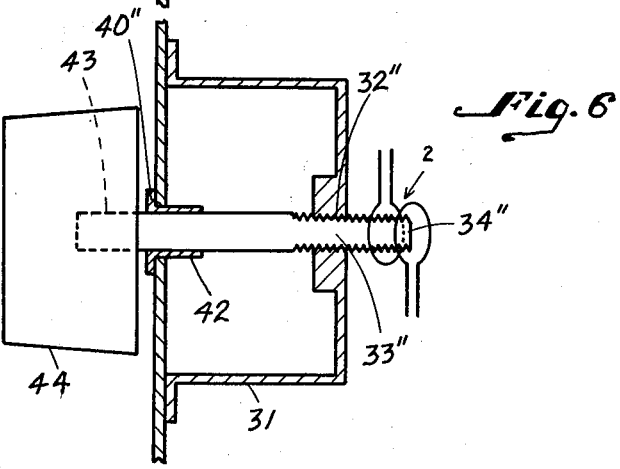

A practical embodiment of the principle described in connection with FIG. 1 will now be described in connection with the block diagram of FIG. 2 and the pulse diagram of FIG. 3. The circuit according to FIG. 2 comprises a transformer matrix 11 having four rows and eight columns thus a total of 32 keys with the corresponding key transformers and a compensation transformer 12.

Preferably each of the primary and secondary windings of each key transformer comprises only one turn, one of the windings being on the front side and the other on the rear side of a double-faced printed circuit board. In order to achieve a simple series connection each turn of a winding is subdivided into two halfturns, the one halfturn of a row or column being series connected with the other halfturns of this row or column and thus forming a loop. In FIG. 2 these loops are indicated by straight lines only. The primary windings of said transformers are fed row-wise with a sinusoidal signal from a generator 15 via a connecting member 13 in form of a 1-out-of-4 decoder with an amplifier 13'.

The generator 15 is controlled by a signal shown in FIG. 3a from a clock generator 16 used throughout in the circuit. The secondary windings of said transformers are connected columnwise via a selecting member 14 in form of an analog multiplexer to an evaluation circuit consisting of logical circuits 19–29. The control of the decoder 13 and the multiplexer 14 is performed by an address counter 17 receiving its stepping signal from clock generator 16 via an AND-gate 18 having two inputs to the other input of which an enabling signal of the evaluation circuit is applied as long as the latter has not detected an operated key. Then the enabling signal changes its logical condition and the counter 17 remains as long on the count corresponding to the address of the operated key as the key remains operated. This key address can be applied by a read pulse on line 30 to a not shown utilisation device either directly or after a conversion in a PROM 31 into a ASCII-code used in keyboards.

The main elements of the evaluation circuit are two AND-gates 19 and 20 each having two inputs. To the respective one of the inputs the output signal of the transformer matrix is applied after a shaping into a pulse signal according to FIG. 3b by an amplifier 24 and a Schmitt-trigger-circuit 25. To the second input of gate 19 there is applied a first strobe signal according to FIG. 3c derived from the clock signal by a monostable multivibrator 21 whereas to the second input of gate 20 there is applied a second strobe signal according to FIG. 3d derived from the clock signal by a monostable multivibrator 22 with an inverter 23 which second strobe signal has a phase shift of 180° with respect to the first strobe signal.

The phase relationship of the signal of generator 15 is chosen with respect to that of the clock signal of generator 16 in such a manner that the output signal of an operated key is in phase with the first strobe signal and the output signal of a nonoperated key is in phase with the second strobe signal.

Thus with operated key an output signal as shown in FIG. 3e appears at the output of AND-gate 19, whereas with nonoperated key an output signal as shown in FIG. 3f appears at the output of AND-gate 20. The output of gate 19 is connected to the counting input of a divide-by-8 counter 26 and to the reset input of a divided-by-8 counter 27. The output of gate 20 is connected to the counting input of the counter 27 and to the reset input of counter 26. The output of counter 26 is connected to the set input and the output of counter 27 to the reset input of an RS-flip-flop 28 the noninverting output Q of which is connected to the input of a monostable multivibrator 29, at the output of which the already mentioned address read pulse on line 30 is delivered which can be seen on FIG. 3j. The output signals of the counters 26 and 27 and that of the flip-flop 28 are represented in FIG. 3g, 3h and 3i, respectively.

The condition of flip-flop 28 indicates whether the last scanned key was operated or not. A signal of the logic condition "1" at the output Q of the flip-flop 28 indicates that a key was detected as an operated key, the simultaneously appearing signal with the logical condition "0" at the output $\overline{Q}$ inhibits the already mentioned AND-gate 18 at the input of the address counter 17.

As already mentioned, there appears with an operated key a pulse signal at the output of AND-gate 19, the first pulse of which could be used for setting flip-flop 28 whereas the first pulse at the output of AND-gate 20 after releasing the key could be used for resetting flip-flop 28.

In fact these signals are applied to the counting and reset inputs, respectively, of the two counters 26 and 27. Since both of these counters divide by 8, there are 8 pulses at the counting input required before the output Q of the corresponding counter changes to the logical condition "1". Since the outputs of both of the AND-gates 19 and 20 are connected both to the counting input of the allocated one of the counters 26, 27 and to the reset input of the respective other counter 27, 26 and since the reset is performed with the first pulse appearing at the reset input, there results the condition that each counter 26, 27 achieves its final count and applies a signal to the flip-flop 28 only if at least eight successive comparison operations give the same result.

This condition results in a very high immunity of the keyboard to disturbance. If e.g. an interference pulse of opposite phase appears shortly after the actuation of a key i.e. prior to its detection as an actuated key, as shown in FIG. 3 on the right hand, then the counter 26 (FIG. 3e) is reset and the counter 27 counts one pulse (FIG. 3f) whereafter counter 26 restarts to count but it does not achieve count eight due to the change of the key address, i.e. the address counter performs a complete cycle before this key can be detected as an actuated one. After releasing the key there are similar operations. In order to have an incorrect output it would be necessary to have eight successive interference pulses of corresponding phase and clock frequency of an amplitude exceeding the respective output voltage of the transformer matrix 11 by the threshold value of the pulseformer circuit 24, 25.

Due to the fact that, with the actuation and releasing of a key, the amplitude of the output voltage of the transformer matrix goes through zero (equality of the amplitudes of the output voltages of key transformer and compensation transformer) and that the pulseformer circuit 24, 25 is provided with a threshold value, there results a definite hyteresis of the key stroke with which a key is detected as a depressed one or as a released one, respectively; due to the above counting condition hysteresis is relatively independent from component tolerances. Further, even with an extremely slow operation of a key, it is not possible to produce a flutter effect. The hysteresis and the counting condition result in a good protection against an unintentional double activation of a key.

Since the address counter 17 controlling the decoder 13 and the multiplexer 14, and further the evaluation circuit with the elements 19 to 29, are supplied with the same clock signal from generator 16, the address counter 17 has to remain on an address at least as long as one of the counters 26 or 27 needs to count eight pulses. In order to achieve this condition, the first three outputs of counter 17 designed as a multistep binary counter are not used so that for the first used output there results a reduction ratio of 1:16. That allows the arrangement to have, beside the possibility that one of the counters 26 or 27 can count to eight, a certain tolerance for transient conditions upon the actuation of a key.

With an assumed clock frequency of 1 MHz, there results a maximum frequency of 62.5 kHz for the change of the key address or a repetition frequency of 2 kHz for scanning a distinct key in a keyboard of 32 keys. That means that after 0.5 ms at the latest a key is detected as a depressed one or a released one.

It will be appreciated that, with another design of the counters 26 and 27 and a corresponding design of the address counter 17, it is possible to change the number of clock pulses or comparison operations, respectively, which are necessary for the detection of a depressed key.

Since, as already mentioned, the output signal with the logical condition "0" appearing at output $\overline{Q}$ of the flip-flop 28 at the detection of a depressed key inhibits the address counter 17 via the AND-gate 18 as long as, after releasing said key, the counter 27 has counted eight pulses, it is secured that the simultaneous actuation of several keys results neither in a misinterpretation nor in a blocking of the keyboard. Rather, only initially depressed key is detected as a depressed key. However, a roll-over from one key to another one is possible since the address counter restarts after releasing the initially depressed key until it arrives at the address of the next depressed key the condition of which can be detected on the basis of the phase of its output signal. Since the detection of the condition of a key is a detection of the phase position of its output signal, the speed of key operation does not influence the result of the detection, i.e. there is performed a static detection of the condition and not a dynamic detection of the change of condition. That means that the mechanical design of the keyboard can be realised rather freely, e.g. with or without snap action in accordance with the requirements of the user.

As already mentioned, the compensation transformer 2 of FIG. 1 or 12 of FIG. 2 produces an overcompensation of the open circuit signal of the respectively scanned unoperated key transformer. By the introduction of the key core the amplitude of the signal applied to the evaluation circuit goes through zero as seen in FIG. 3b and increases then again with a further introduction of the core, but with opposite phase.

This fact can be used for a simple adjustment of the key stroke needed for a response of the evaluation circuit. If the amount of the overcompensation is made adjustable e.g. by providing the compensation transformer with a mechanically adjustable core, e.g. with the aid of a screw, simultaneously with the adjustment of this core there will be adjusted the key stroke of all keys, which stroke is necessary to achieve that at the output of AND-gate 19 there will appear pulses which can be counted for a detection of a key operation, i.e. the key stroke needed for the detection of a depressed key.

The arrangement for adjustment of the key stroke needed for the detection can be designed so that it is accessible to the user of the keyboard at any time, but it is also possible to make this adjustment arrangement accessible to the maintenance personnel only.

What is claimed is:

1. Contactless keyboard comprising a plurality of keys; a plurality of key transformers each associated with one of said keys and including a primary and a secondary winding and a plunger-type core movable relative to the respective key transformer between a retracted and an extended position in response to the operation of the associated key; a plurality of individual first electric branches each connecting said primary windings of a first group of said key transformers in series with one another; a plurality of individual second electric branches each connecting said secondary windings of a second group of said key transformers in series with one another such that each of said key transformers of any one of said first groups is a member of a different one of said second groups; a source of alternating electric current; means for distributing the alternating electric current in succession to said first branches for the electric current to flow through said primary windings and induce voltages of a first direction in said secondary windings of said key transformers of the respective first group, such voltages being of a higher first magnitude with the respective core in said extended position and of a lower second magnitude with the respective core in said retracted position, said distributing means including a connecting member; a compensating transformer common to said key transformers and including a primary winding connected in series with all of said first branches and a secondary winding connected in series with all of said second branches, said primary and secondary windings of said compensating transformer being so arranged relative to one another that flow of the electric current through said primary winding thereof induces in said secondary winding thereof a voltage of an opposite second direction and of a magnitude between said first and second magnitudes with attendant phase reversal in the respective second branch upon movement of said core between said extended and retracted positions; selecting means including a selecting member having an output and operative for connecting said second branches in succession to said output to supply output signals thereto; and evaluating means connected to said output and operative for evaluating the phase of the output signals, including phase comparison means operative for comparing the phase of the respective output signal with that of a reference signal.

2. Keyboard according to claim 1, wherein the phase comparison means comprises counting means which delivers an output signal only after a distinct number of successive comparison operations giving the same result.

3. Keyboard according to claim 2, wherein the phase comparison means comprises two AND-gates each having two inputs and an output, and a pulseformer circuit having an input connected to said output of said selecting means and an output connected to one of said inputs of each of said AND-gates; and further comprising means including a clock generator for generating a clock signal and an inverted clock signal and means for supplying the clock signal to the other of said inputs of one of said AND-gates and the inverted clock signal to the other of said inputs of the other of said AND-gates.

4. Keyboard according to claim 3, wherein said counting means includes a first and a second counter each having a counting input and a reset input; and wherein the output of said one AND-gate is connected to the counting input of the first counter and to the reset input of the second counter and the output of the other AND-gate is connected to the counting input of the second counter and to the reset input of the first counter.

5. Keyboard according to claim 4, wherein said comparing means further includes an RS-flip-flop; and wherein the output of the first counter is connected to the set input of the RS-flip-flop and the output of the second counter to the reset input so that the output of the flip-flop indicates whether the key selected by the connecting member and the selecting member is depressed or not.

6. Keyboard according to claim 5, further comprising an address counter having an input and a plurality of outputs, and an additional AND-gate having two inputs and one output connected to the address counter; wherein the connecting member and the selecting member are connected to the outputs of an address counter; wherein the clock signal of the clock generator is supplied to one of said inputs of said additional AND-gate while the other input of said additional AND-gate is connected to the inverted output of the RS-flip-flop so that the stepping of the address counter is inhibited when the flip-flop goes into its condition which corresponds to a depressed key whereby the count of the address counter indicates the address of the depressed key.

7. Keyboard according to claim 6, further comprising a translator connected to the outputs of the address counter and operative for translating the key address given by the count into a code generally used for keyboards.

8. Keyboard according to claim 1, wherein the compensation transformer includes a plunger-type core the penetration of which is adjustable by mechanical means in order to adjust the amount of overcompensation and therewith for all keys in common the key stroke needed for a response of the evaluation means to the actuation of a key.

9. Keyboard according to claim 8, wherein the mechanical means for adjusting the penetration depth of the core of the compensation transformer includes a screw and a nut.

10. Keyboard according to claim 8, wherein the mechanical means for adjusting the penetration depth of the core of the compensation transformer includes an eccentric disk acting upon the spring loaded plunger-type core.

11. Keyboard according to claim 9 or 10, wherein the means for adjusting the penetration depth of the core are accessible to the user of the keyboard.

* * * * *